(12) United States Patent
Furumiya

(10) Patent No.: US 6,333,525 B1
(45) Date of Patent: Dec. 25, 2001

(54) CHARGE TRANSFER APPARATUS AND MANUFACTURE METHOD THEREOF

(75) Inventor: Masayuki Furumiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/547,228

(22) Filed: Apr. 11, 2000

(30) Foreign Application Priority Data

Apr. 20, 1999 (JP) .................................................. 11-111719

(51) Int. Cl.[7] .......................... H01L 27/148; H01L 29/768
(52) U.S. Cl. ............................................. 257/215; 257/249
(58) Field of Search .................................. 257/239, 249, 257/250

(56) References Cited

U.S. PATENT DOCUMENTS

| | | | |
|---|---|---|---|
| 4,087,832 | * | 5/1978 | Jambotkar . |
| 5,345,099 | * | 9/1994 | Yamada ................................. 257/250 |
| 6,018,170 | * | 1/2000 | Hatano et al. ........................ 257/249 |

FOREIGN PATENT DOCUMENTS 5-218104   8/1993   (JP) .

* cited by examiner

*Primary Examiner*—Ngân V. Ngô
(74) *Attorney, Agent, or Firm*—Young & Thompson

(57) ABSTRACT

There is disclosed a charge transfer apparatus in which with respect to a signal charge detector, a gate insulation film under an output electrode and a reset electrode is formed of one layer of a silicon oxide film. As a result, even when the device is charged up during a manufacture process, the charge injection to the gate insulation film under the output electrode and reset electrode can be prevented. Therefore, the threshold value dispersion of the output electrode or the reset electrode is suppressed, and the charge transfer apparatus with uniform characteristics can be provided. Furthermore, by forming the silicon oxide film under the output electrode and reset electrode to be thick, the capacity formed of a floating diffusion layer and the parasitic capacity of the output electrode, and the capacity formed of the floating diffusion layer and the parasitic capacity of the reset electrode are reduced. Since the detection capacity formed of the floating diffusion layer is reduced, the charge/voltage conversion efficiency of the signal charge detector of the charge transfer apparatus, that is, a detection sensitivity can be increased.

3 Claims, 15 Drawing Sheets

CHARGE TRANSFER APPARATUS AND MANUFACTURE METHOD THEREOF

BACKGROUND OF THE INVENTION

1. Field of the Invention

The present invention relates to a charge transfer apparatus which reduces the detection capacity of a signal charge detector and enhances the detection sensitivity. Particularly, there is provided a signal charge detector which suppresses the threshold value dispersion of an output electrode and a reset electrode and has stable characteristics.

2. Description of the Related Art

A charge transfer apparatus which accumulates and transfers information such as incident light and electric signal in the form of electric charges and extracts the information as a voltage signal has been broadly used for applications such as a solid image pickup apparatus in recent years. The solid image pickup apparatus is constituted of a photoelectric converter for converting light to an electric signal (signal charge), a charge transfer section for transferring the converted signal charge, and a signal charge detector (signal output section) for detecting the signal charge transferred from the charge transfer section. A charge coupled device (hereinafter abbreviated as CCD) is used as the charge transfer section. To detect the signal charge, a floating diffusion type signal charge detector is usually used.

FIG. 1 is a sectional view showing an interline transfer system CCD type solid image pickup apparatus disclosed in Japanese Patent Application Laid-Open No. 218104/1993.

Formed on a P-type semiconductor substrate 1 are an N-type impurity diffusion layer 2 as an embedded channel region, a device separating P-type impurity diffusion layer 3, a device separating oxide film 4a, and a gate insulation film 5. A first gate electrode 6 formed of polycrystalline silicon as a transfer electrode, and a second gate electrode 8 formed of polycrystalline silicon are formed on the gate insulation film 5. An insulation film 7 is formed on the surface of the first gate electrode 6, and a potential barrier P-type diffusion layer 9 is formed on the semiconductor substrate under the second gate electrode 8. Each first gate electrode of the charge transfer section is electrically connected to the second gate electrode on the left side. Clocks $\phi 1$, $\phi 2$ are alternately applied to the connection part of the first and second gate electrodes.

A fixed output gate voltage V2 is applied to an output gate electrode 10. An N-type floating diffusion layer 11 as the embedded channel region for detecting a transfer charge amount is formed in the same process as that of the N-type impurity diffusion layer 2. The potential change of the N-type floating diffusion layer 11 is detected by an output transistor 14. A reset drain voltage V1 is applied to an N-type drain diffusion layer 12. The potential of the N-type floating diffusion layer 11 is periodically set to the reset drain voltage V1 by a reset gate electrode 13.

The operation of this charge transfer apparatus will be described. First, by applying a reset pulse to the reset gate electrode 13, the potential of the N-type floating diffusion layer 11 is reset to the reset drain voltage V1. In this case, the clock $\phi 1$ has a high potential, the clock $\phi 2$ has a low potential, and the electric charge is accumulated under the first gate electrode to which $\phi 1$ is applied. Subsequently, when the clock $\phi 1$ is set to the low potential, and the clock $\phi 2$ is set to the high potential, the electric charge under the final gate electrode (first gate electrode) with the clock $\phi 1$ applied thereto flows into the N-type floating diffusion layer 11 through a channel under the output gate electrode 10. As a result, a potential change is generated in the N-type floating diffusion layer 11, and the potential change is detected by the output transistor 14.

When the charge amount of the signal charge transferred to the N-type floating diffusion layer 11 is Q, and the capacity of the N-type floating diffusion layer 11 is C, the potential change $\Delta V$ of the N-type floating diffusion layer 11 before and after the flow-in of the electric charge is as follows:

$$\Delta V = Q/C.$$

The magnitude of the output signal to the signal charge amount Q increases as the capacity C of the floating diffusion layer 11 decreases. Specifically, as the capacity C of the floating diffusion layer 11 decreases, the detection sensitivity defined by the output voltage to the constant signal charge amount Q rises.

Therefore, in order to enhance the detection sensitivity, in the charge transfer apparatus disclosed in the Japanese Patent Application Laid-Open No. 218104/1993, an insulation film 4b on the surface of the N-type floating diffusion layer 11 is formed in the same process as that of the device separating insulation film 4a. By disposing the insulation film 4b thicker than the gate insulation film 5 in this manner, the capacity of the floating diffusion layer is decreased, and the detection sensitivity of the signal charge is enhanced.

However, the reduction of the capacity C is insufficient in this charge transfer apparatus.

Moreover, in the charge transfer apparatus, the insulation film 4b on the surface of the N-type floating diffusion layer 11 is formed in the same process as that of the device separating insulation film 4a. In this case, however, three mask formation processes are necessary for the ion injection for forming the P-type impurity diffusion layer 3 under the device separating insulation film 4a, the ion injection for forming the N-type floating diffusion layer 11, and the formation of the insulation films 4a, 4b on the P-type impurity diffusion layer 3 and N-type floating diffusion layer 11. It is difficult to match the masks, and there is a problem that the apparatus provided with a desired performance cannot be formed.

SUMMARY OF THE INVENTION

An object of the present invention is to solve the above-described problem, and to provide a charge transfer apparatus with an enhanced detection sensitivity. Further object of the present invention is to provide a method of manufacturing a charge transfer apparatus provided with stable characteristics, in which the dispersions of the respective threshold values of an output electrode and a reset electrode of the charge transfer apparatus are suppressed.

A charge transfer apparatus according to this invention is featured mainly by providing a gate insulation film of said charge transfer electrode that comprises a multilayered film of a first silicon oxide film, a silicon nitride film, and a second silicon oxide film, and at least one of the gate insulation films of said output electrode and said reset electrode that is formed of a third silicon oxide film.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

First Embodiment

Figure 1:
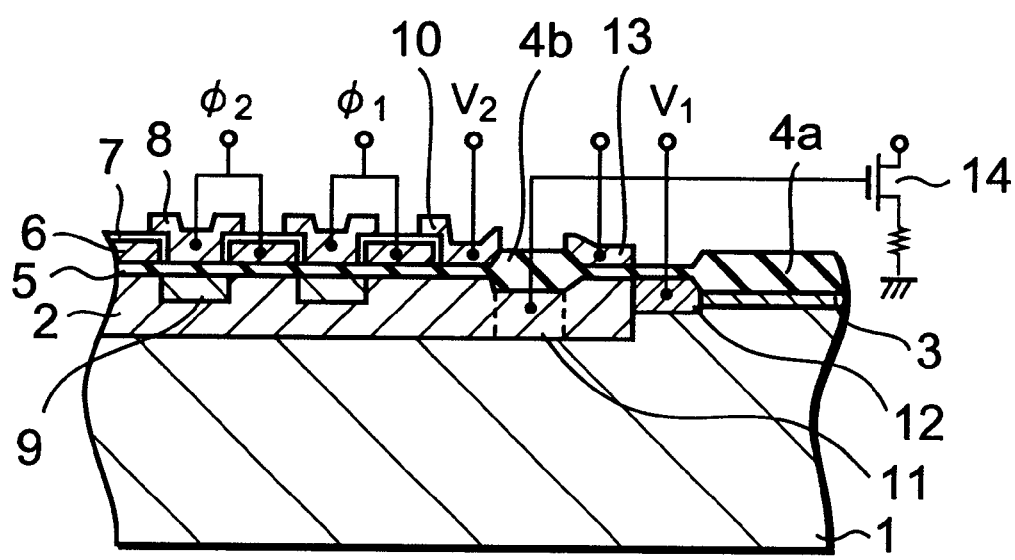
FIG. 1 is a sectional view of the periphery of a signal charge detector in a conventional charge transfer apparatus.
Figure 2:
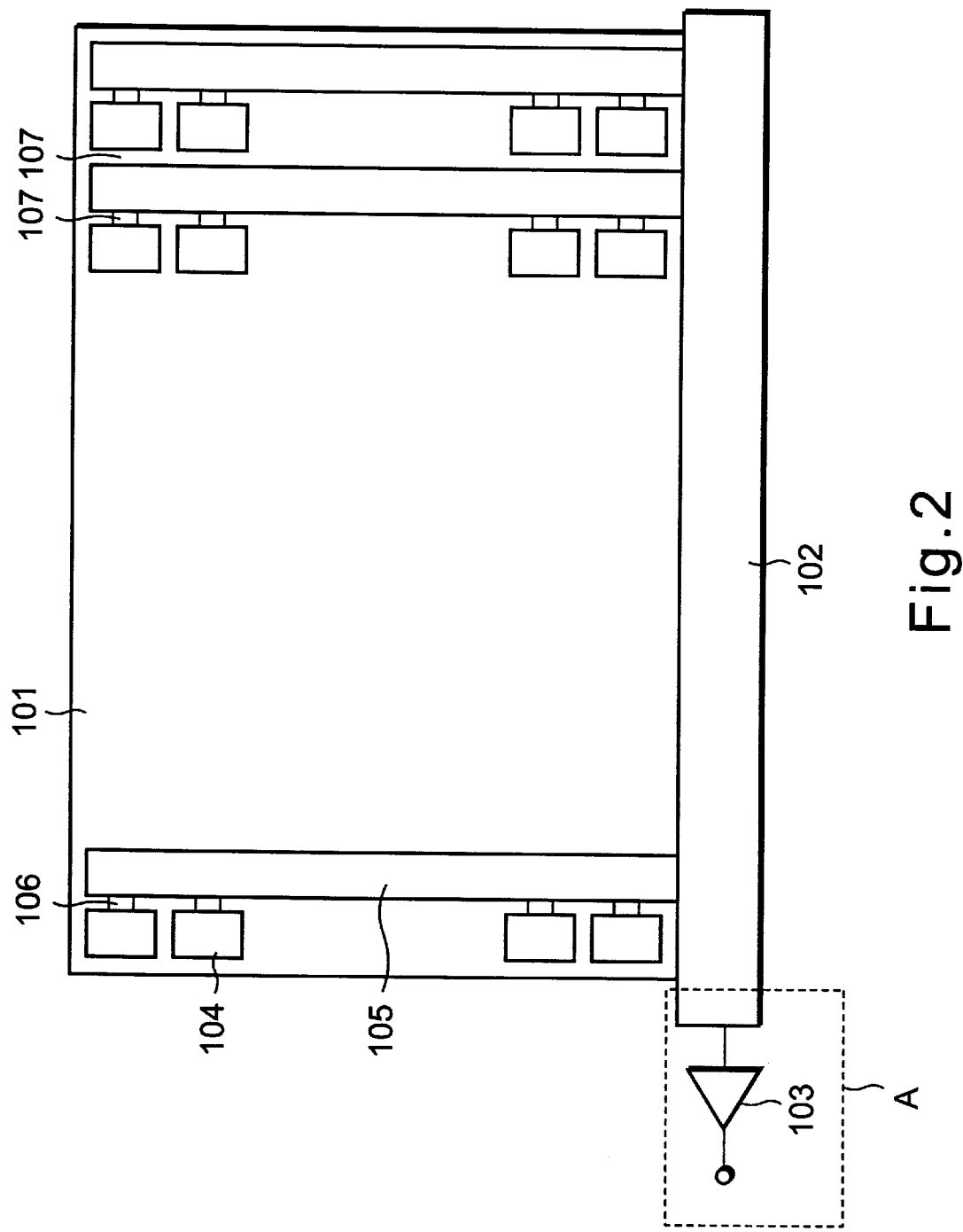
FIG. 2 is a plan view of a CCD type solid image pickup apparatus according to a first embodiment of the present invention.

FIG. 2 is a plan view of a CCD type solid image pickup apparatus of an interline transfer system.

The image pickup apparatus is constituted of an image pickup region 101, a horizontal CCD 102, and an output amplifier 103. In the image pickup region 101, a plurality of photodiodes (photoelectric converting devices) 104 for photoelectrically converting a light to a signal charge, and accumulating the signal charge are arranged in two-dimensional matrix. Furthermore, a vertical CCD 105 for transferring the signal charge in a vertical direction is disposed adjacent to each photodiode row. A reader 106 for reading the signal charge to the vertical CCD 105 from each photodiode 104 is disposed between the photodiode 104 and the vertical CCD 105. The part other than the above-described part in the image pickup region 101 is a device separating region 107.

The operation of the image pickup apparatus will next be described. The signal charge photoelectrically converted and accumulated by the photodiode 104 for a given time is passed through the reader 106 and read by the vertical CCD 105. The signal charge read by the vertical CCD 105 is transferred in the vertical direction toward the horizontal CCD 102. The signal charge transferred to the horizontal CCD 102 from each vertical CCD 105 is transferred in a horizontal direction toward the output amplifier 103 through the horizontal CCD 102, and detected as an output voltage by the output amplifier 103.

Figure 3:
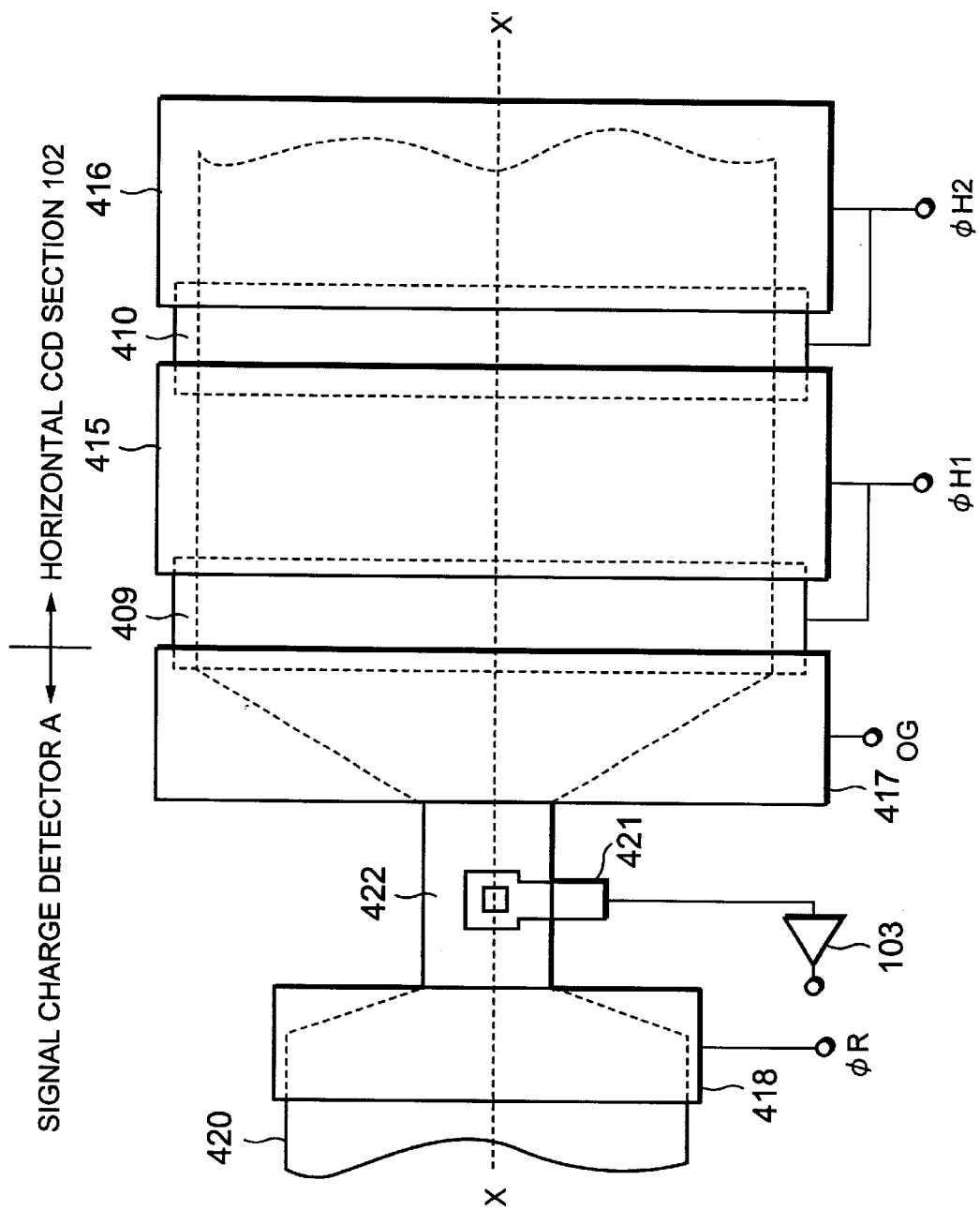
FIG. 3 is a plan view of the periphery of the signal charge detector of the CCD type solid image pickup apparatus according to the first embodiment of the present invention.

FIG. 3 is an enlarged plan view of a signal charge detector A in the periphery of the output amplifier 103 of FIG. 2.

Horizontal charge transfer electrodes 409, 410, 415, and 416 are disposed on the transfer channel of the horizontal CCD 102. An output electrode (output gate: OG) 417 is disposed between the terminal end of the horizontal CCD 102 and a floating diffusion layer 422. Moreover, a reset electrode (φR) 418 is disposed between the floating diffusion layer 422 and a reset drain 420. An N-type embedded channel layer of the region held between the output electrode 417 and the reset electrode 418 is formed as the floating diffusion layer 422.

A contact is taken, and an N⁺ layer extraction wiring 421 is connected to a high-concentration N-type impurity layer 419 of the floating diffusion layer 422.

Figure 4:
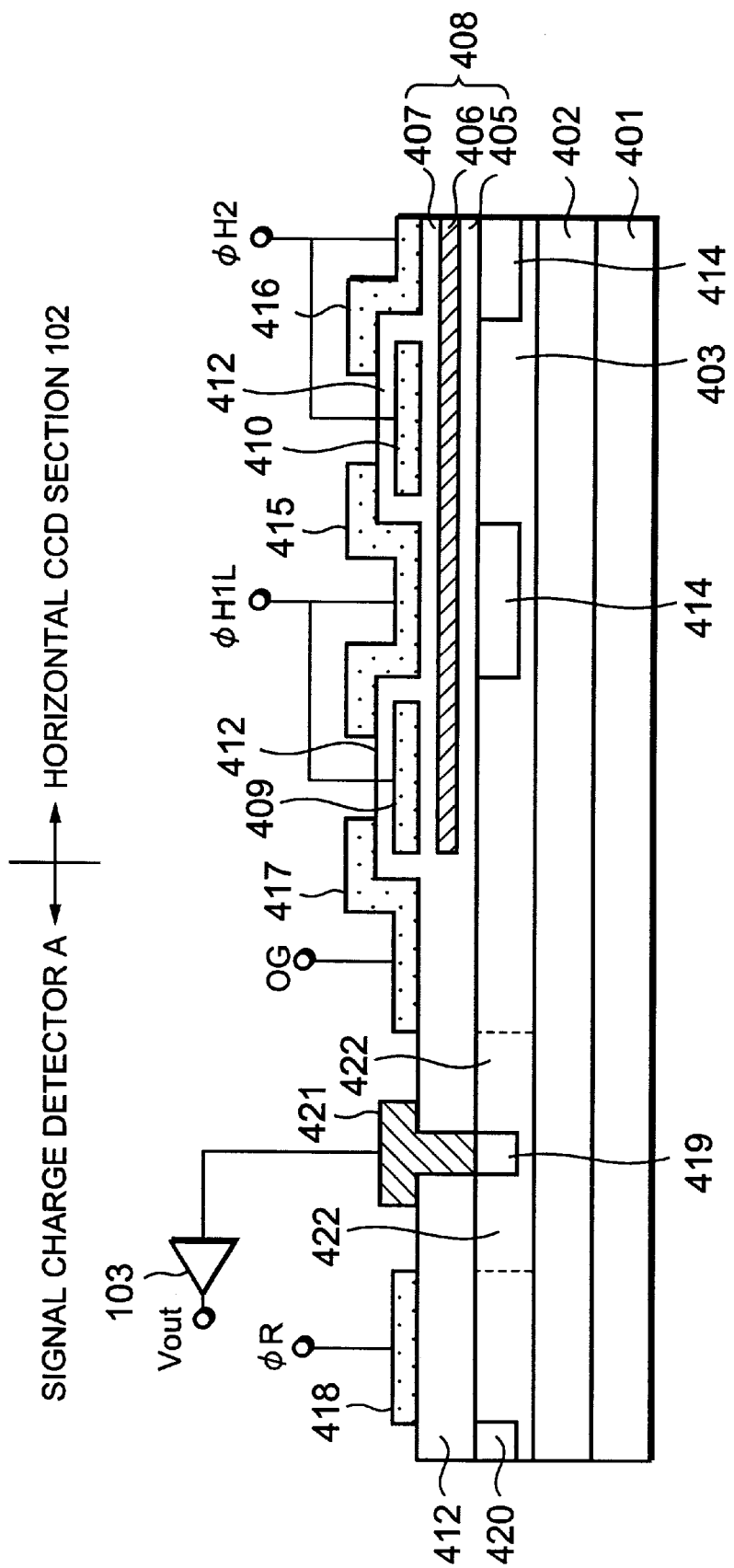
FIG. 4 is a sectional view of the periphery of the signal charge detector of a charge transfer apparatus according to the first embodiment of the present invention, and a sectional view along X–X' of FIG. 3.

FIG. 4 is a sectional view along X–X' of FIG. 3, and a sectional schematic view of the charge transfer direction of the charge transfer apparatus including the horizontal CCD 102, floating diffusion layer 422, and reset drain 420 according to the first embodiment of the present invention.

An N-type embedded channel 403 to form the charge transfer channel is formed on a P-type well 402 on an N-type substrate 401. The horizontal CCD 102 is formed on this N-type embedded channel 403. The horizontal CCD 102 includes the horizontal charge transfer electrodes 409, 410, 415, 416 formed of a polysilicon film, and the like formed on the N-type embedded channel 403 via a gate insulation film 408.

The gate insulation film 408 under the horizontal charge transfer electrodes 409, 410, 415, 416 of the horizontal CCD 102 is constituted of a three-layer multilayered film (ONO film) in which silicon oxide films ($SiO_2$) 407 and 405 are disposed on the top and under surfaces of a silicon nitride film ($Si_3N_4$) 406. A gate insulation film 412 disposed under the output gate 417 and reset electrode 418 is constituted of one layer of the silicon oxide film.

The channel region of the horizontal CCD 102 is covered with the first horizontal charge transfer electrodes 409, 410 and second horizontal charge transfer electrodes 415, 416. These electrodes are usually constituted of two layers of polysilicon films. The first horizontal charge transfer electrodes 409, 410 form the first layer, and the second horizontal charge transfer electrodes 415, 416 form the second layer. Storage electrodes 409, 410 which are the first horizontal charge transfer electrodes and barrier electrodes 415, 416 which are the second horizontal charge transfer electrodes are alternately formed. The same pulse signal is applied to the storage electrode 409 and barrier electrode 415, and the same pulse signal is applied to the storage electrode 410 and barrier electrode 416. An N-type impurity layer 414 under the barrier electrodes 415, 416 has a lower concentration than that of the N-type impurity layer 403 under the storage electrodes 409, 410. Therefore, even when the same pulse signal is applied to the storage electrode 409 and barrier electrode 415, a difference in electric potential is generated in the channel region. Similarly, even when the same pulse signal is applied to the storage electrode 410 and barrier electrode 416, a difference in electric potential is generated in the channel region. Thereby, the charge transfer is provided with a direction property.

The detection capacity is constituted of the floating diffusion layer 422 via the output electrode (output gate: OG) 417 on the terminal end of the horizontal CCD 102. The signal charge transferred through the transfer channel of the horizontal CCD 102 is passed under the final horizontal charge transfer electrode 409 and output gate 417 and transferred to the floating diffusion layer 422 to vary the potential of the floating diffusion layer 422. The potential change is transmitted to the output amplifier 103 through the $N^+$ layer extraction wiring 421, and detected as the signal potential change. The high-concentration N-type impurity layer 419 is formed to extract the signal charge accumulated in the detection capacity. The $N^+$ layer extraction wiring 421 is connected to the high-concentration N-type impurity layer 419.

After the signal charge is detected, by applying a plus potential to the reset electrode (φR) 418 to drain the signal charge to the reset drain 420, the potential of the detection capacity is reset.

Additionally, in the two-dimensional CCD image sensor, the photodiode and vertical CCD are disposed in the other area (not shown), and these constitute the solid image pickup apparatus.

Figure 5:
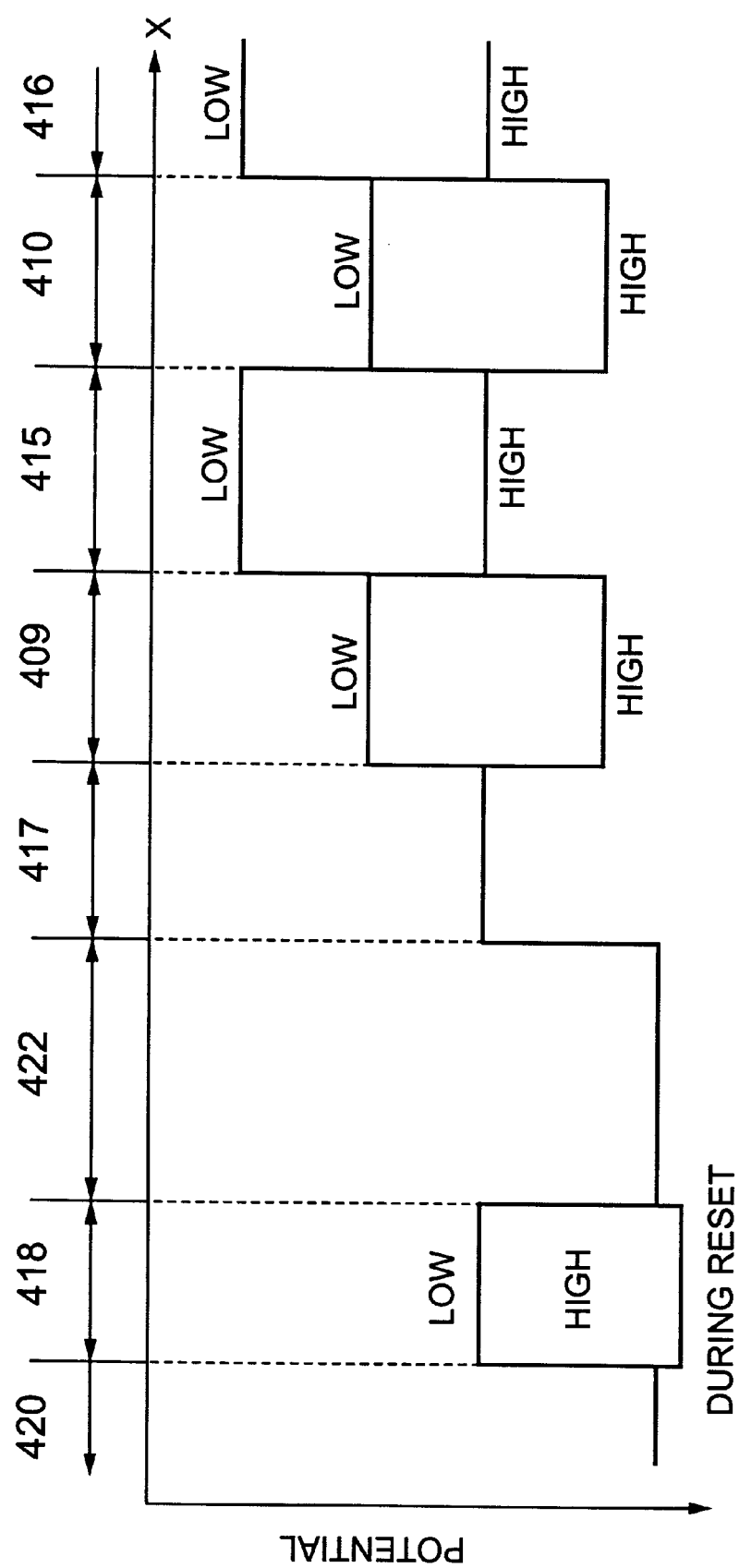
FIG. 5 is a schematic view showing a potential distribution in the periphery of the signal charge detector of the charge transfer apparatus according to the first embodiment of the present invention.

FIG. 5 is a schematic view showing a potential distribution in each section of FIG. 4. In FIG. 5, as shown by a solid line, when the potential of the final horizontal charge transfer electrode 409 is set to L level, the signal charge is passed under the output gate 417, transferred to the floating diffusion layer 422, and temporarily accumulated in the layer. In this case, the potential of the reset electrode 418 has L level. In this state, the potential change of the floating diffusion layer 422 is detected using the output amplifier 103.

After the signal charge is detected, and when the potential of the reset electrode 418 is set to H level, the signal charge is discharged to the reset drain 420, and the potential of the floating diffusion layer 422 is reset.

A method of manufacturing the solid image pickup apparatus according to the first embodiment of the present invention will next be described with reference to FIGS. 6 to 14. FIGS. 6 to 14 are process diagrams in the same section as that of FIG. 4, the right side of the drawing shows the horizontal CCD 102, and the left side shows the reset drain 420.

Figure 6:
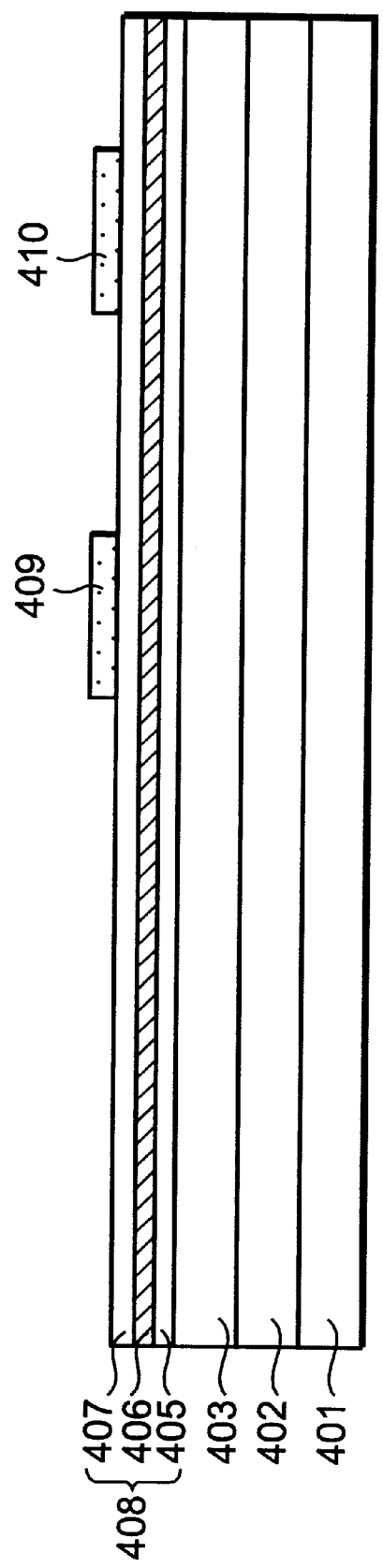
FIG. 6 is a sectional view showing a manufacture method in the periphery of the signal charge detector of the charge transfer apparatus according to the first embodiment of the present invention.

In FIG. 6, the P-type well 402 is formed on the N-type substrate 401. The N-type embedded channel 403 is formed in a part which is to form the horizontal CCD 102, output electrode 417, floating diffusion layer 422, reset electrode 418, and vertical CCD (not shown).

Subsequently, the silicon oxide film ($SiO_2$) 405, silicon nitride film ($Si_3N_4$) 406, and silicon oxide film ($SiO_2$) 407 are formed on the N-type embedded channel 403. The ONO film constituted of these silicon oxide film ($SiO_2$) 405, silicon nitride film ($Si_3N_4$) 406, and silicon oxide film ($SiO_2$) 407 is the gate insulation film 408. After the polysilicon film is formed on this gate insulation film 408, patterning is performed using a photolithography process, so that the storage electrodes 409, 410 as the horizontal charge transfer electrodes are formed.

Figure 7:
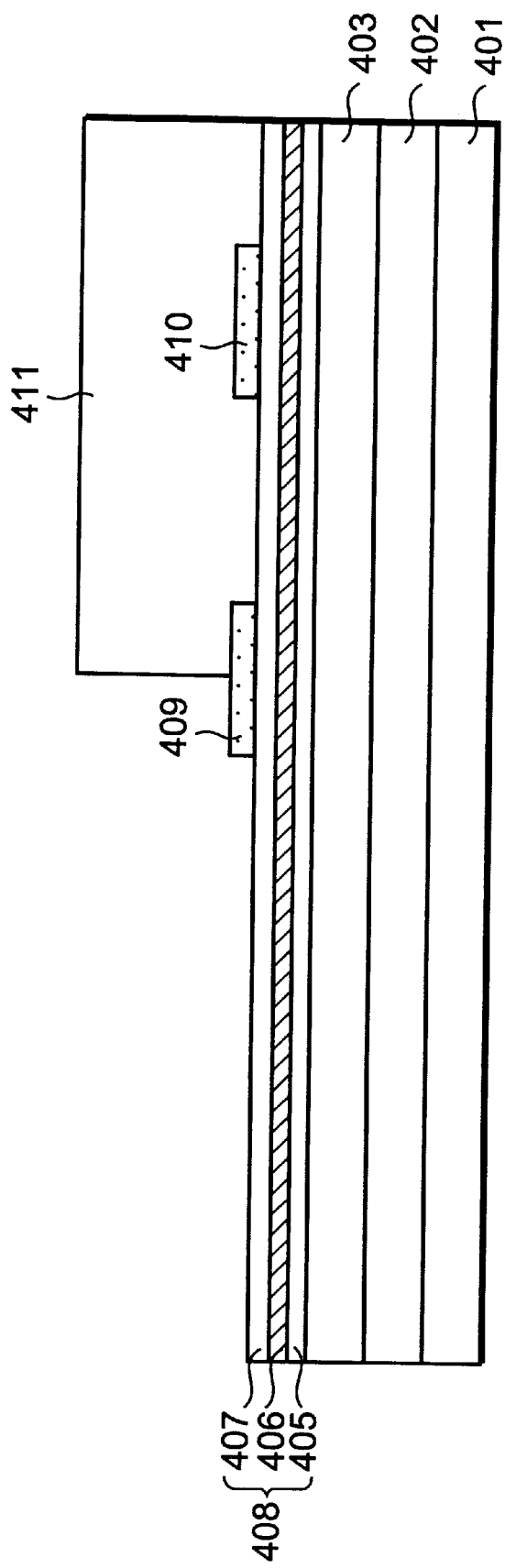
FIG. 7 is a sectional view showing the manufacture method in the periphery of the signal charge detector of the charge transfer apparatus according to the first embodiment of the present invention.

Subsequently, in FIG. 7, in the processes subsequent to the boundary of the final horizontal charge transfer electrode 409, the region, other than the region in which the output gate 417, floating diffusion layer 422, and reset electrode 418 are formed to constitute the signal charge detector A, is covered with a photoresist 411.

Figure 8:
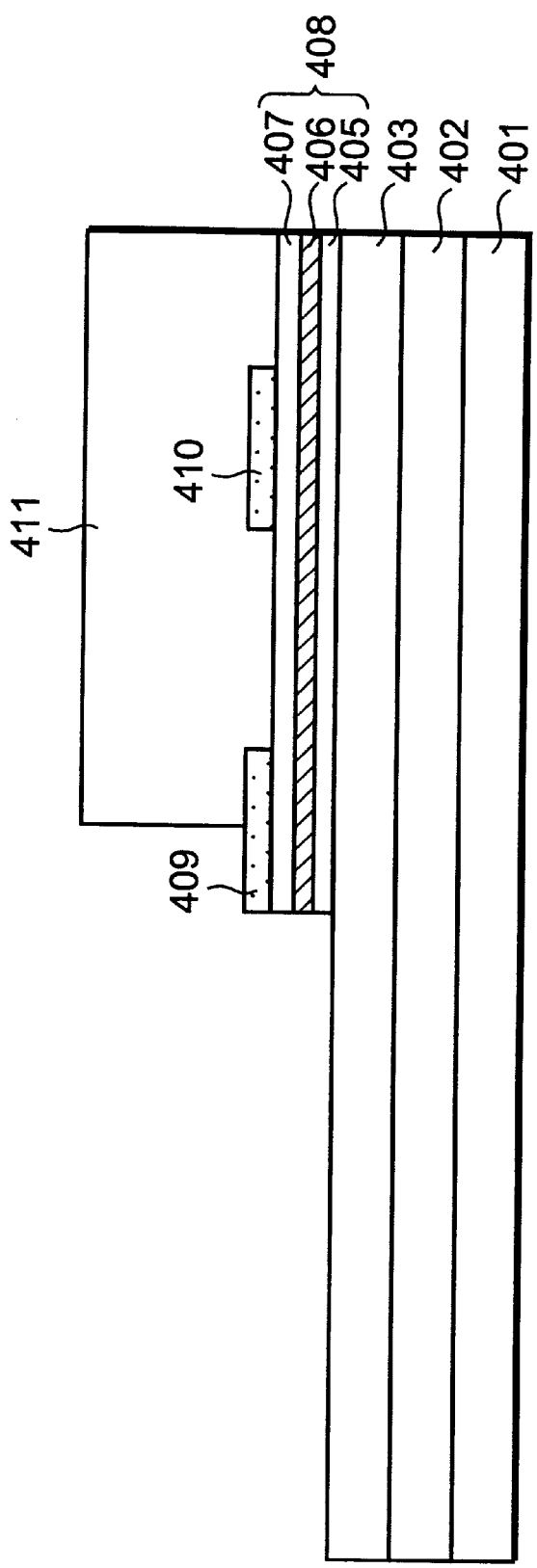
FIG. 8 is a sectional view showing the manufacture method in the periphery of the signal charge detector of the charge transfer apparatus according to the first embodiment of the present invention.

Thereafter, in FIG. 8, by performing etching with regard to the final horizontal charge transfer electrode 409 in a self-matching manner, the ONO film is removed from the region expected to form the signal charge detector A.

In FIG. 8, by completely removing the ONO film as the gate insulation film 408 from the region expected to form the signal charge detector A, a silicon substrate surface is exposed. However, in order to prevent the silicon substrate surface from being damaged by the etching, the silicon oxide film 407 and silicon nitride film 406 are removed from the ONO film by etching, and the lowermost layer as the silicon oxide film 405 may be left.

Figure 9:
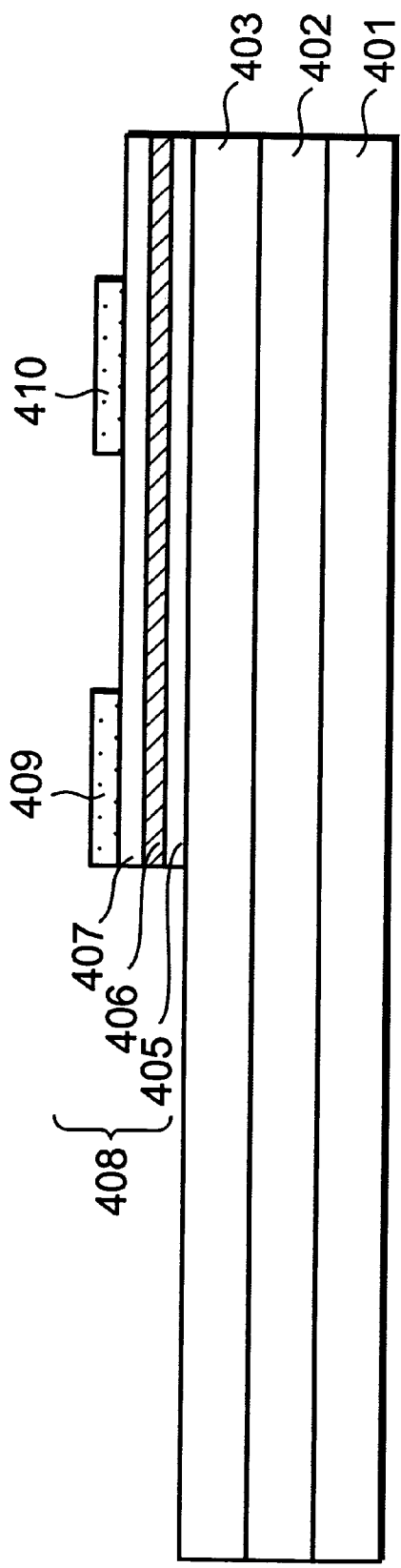
FIG. 9 is a sectional view showing the manufacture method in the periphery of the signal charge detector of the charge transfer apparatus according to the first embodiment of the present invention.

Subsequently, in FIG. 9, the photoresist film 411 is removed.

Figure 10:
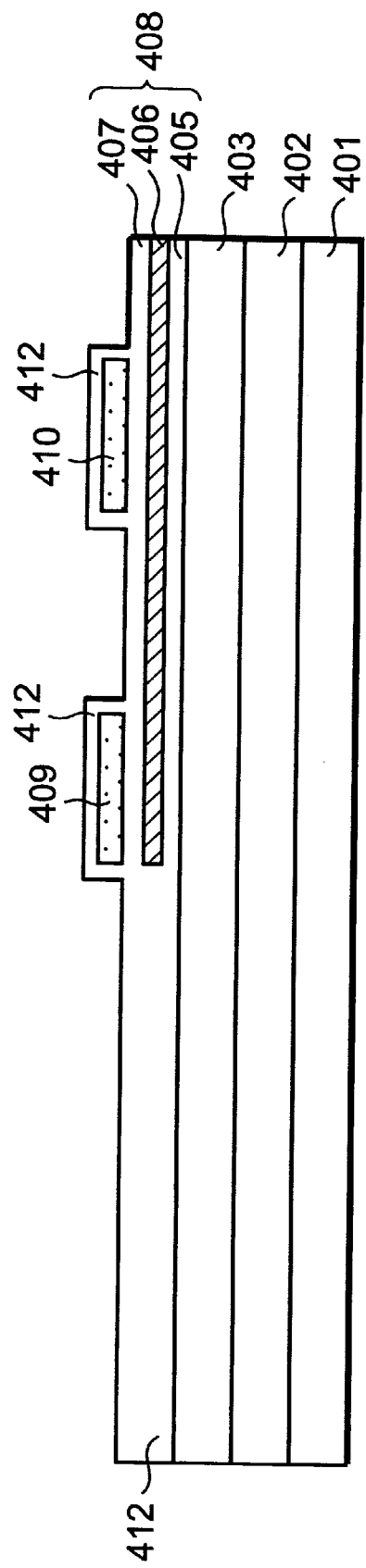
FIG. 10 is a sectional view showing the manufacture method in the periphery of the signal charge detector of the charge transfer apparatus according to the first embodiment of the present invention.

Next, in FIG. 10, the silicon oxide film 412 is formed on the entire surface by thermal oxidation. As a result, the silicon oxide film 412 is formed on the upper parts and side walls of the storage electrodes 409, 410, and on the surface of the region expected to form the signal charge detector A.

The silicon oxide film 412 of the signal charge detector A can be formed to provide a uniform thickness, because the base is uniformly formed of the N-type embedded channel 403. The silicon oxide film 412 is formed so that the film thickness in the signal charge detector A is in a range of 40 nm to 100 nm. The film thickness is preferably large in order to reduce the capacity of the floating diffusion layer 422, which is the object of the present invention. However, in the silicon oxide film 412, a contact hole to reach the high-concentration N-type impurity layer 419 needs to be formed in the later process of FIG. 14. Furthermore, the contact hole is formed in the process common to the process of forming a contact hole in another thin insulation film part. Therefore, if the silicon oxide film 412 is formed to be excessively thick, it becomes difficult to form the contact hole, so that the upper limit of the thickness of the silicon oxide film 412 is 100 nm.

Figure 11:
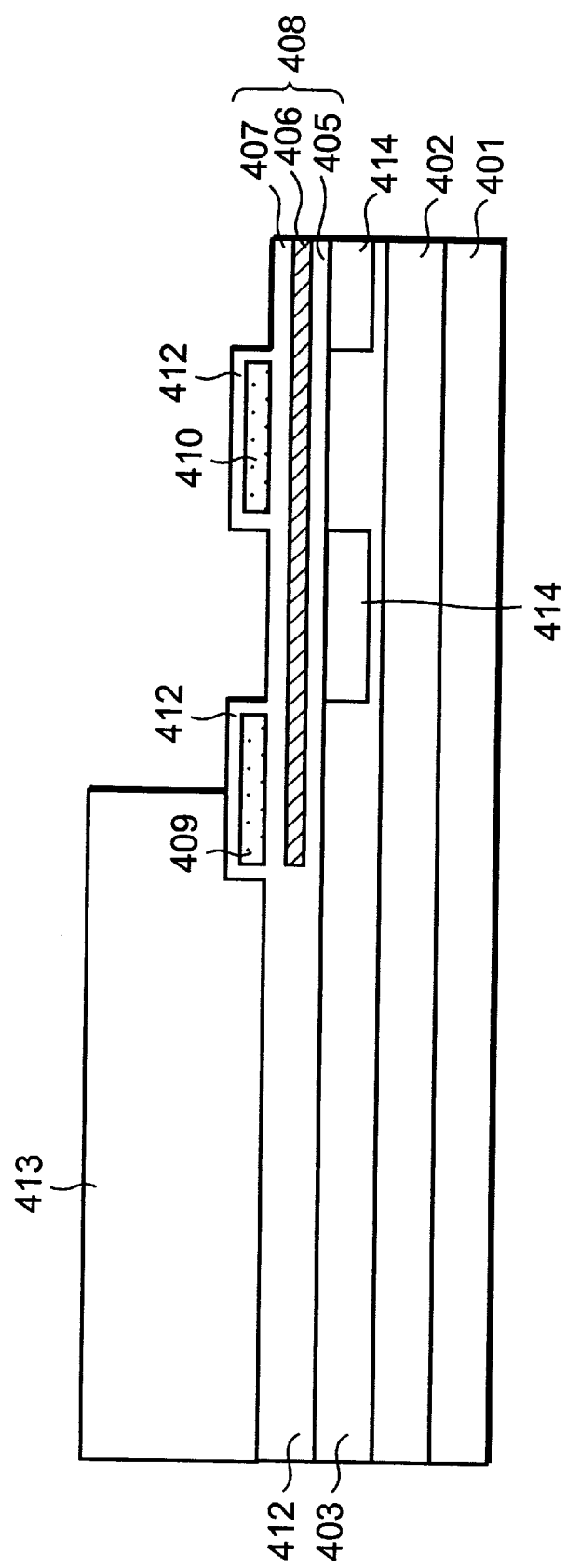
FIG. 11 is a sectional view showing the manufacture method in the periphery of the signal charge detector of the charge transfer apparatus according to the first embodiment of the present invention.

In FIG. 11, from the boundary of the final horizontal charge transfer electrode 409, the region expected to form the signal charge detector A is covered with a photoresist 413. Thereafter, boron ion injection is performed with respect to the final horizontal charge transfer electrode 409 in the self-matching manner. Thereby, the concentration of the N-type embedded channel 403 of the region in which the barrier electrodes 415, 416 are to be formed is lowered, so that the N-type impurity layer 414 is formed.

Figure 12:
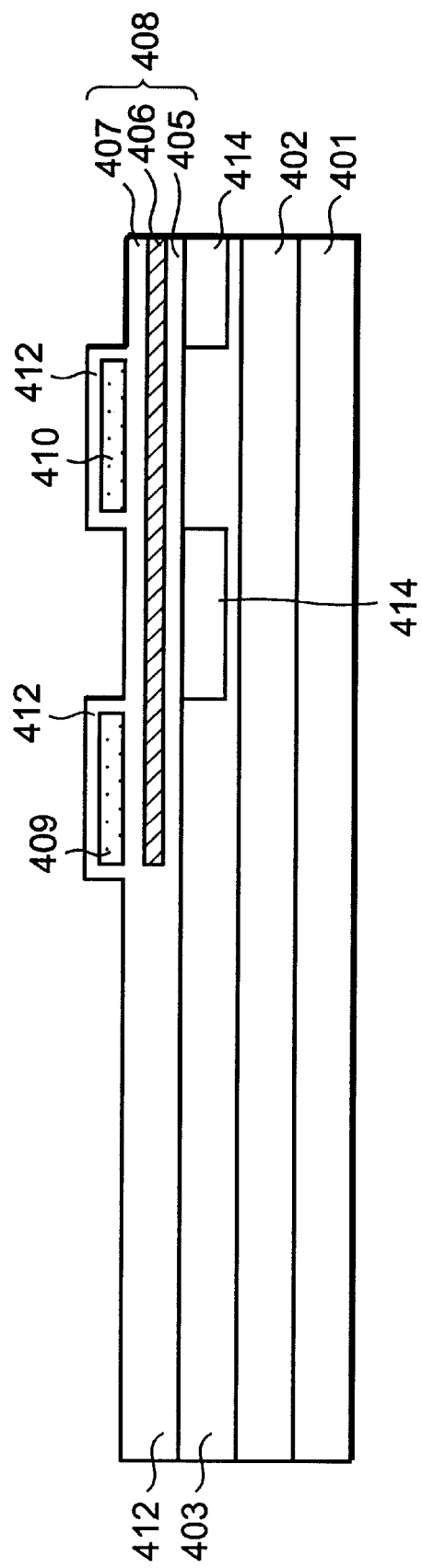
FIG. 12 is a sectional view showing the manufacture method in the periphery of the signal charge detector of the charge transfer apparatus according to the first embodiment of the present invention.

In FIG. 12, the photoresist film 413 is removed.

Figure 13:
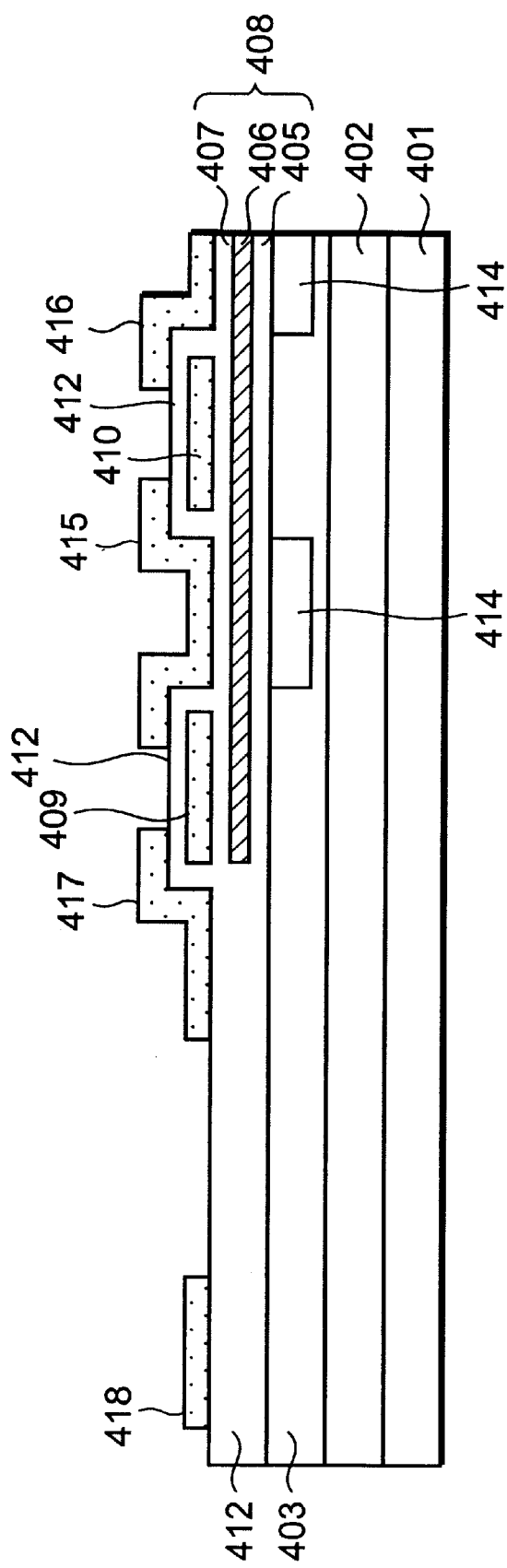
FIG. 13 is a sectional view showing the manufacture method in the periphery of the signal charge detector of the charge transfer apparatus according to the first embodiment of the present invention.

In FIG. 13, after forming a polysilicon film which is a second layer, the patterning is performed using the photolithography process, so that the barrier electrodes 415, 416, output electrode 417, and reset electrode 418 are formed.

Figure 14:
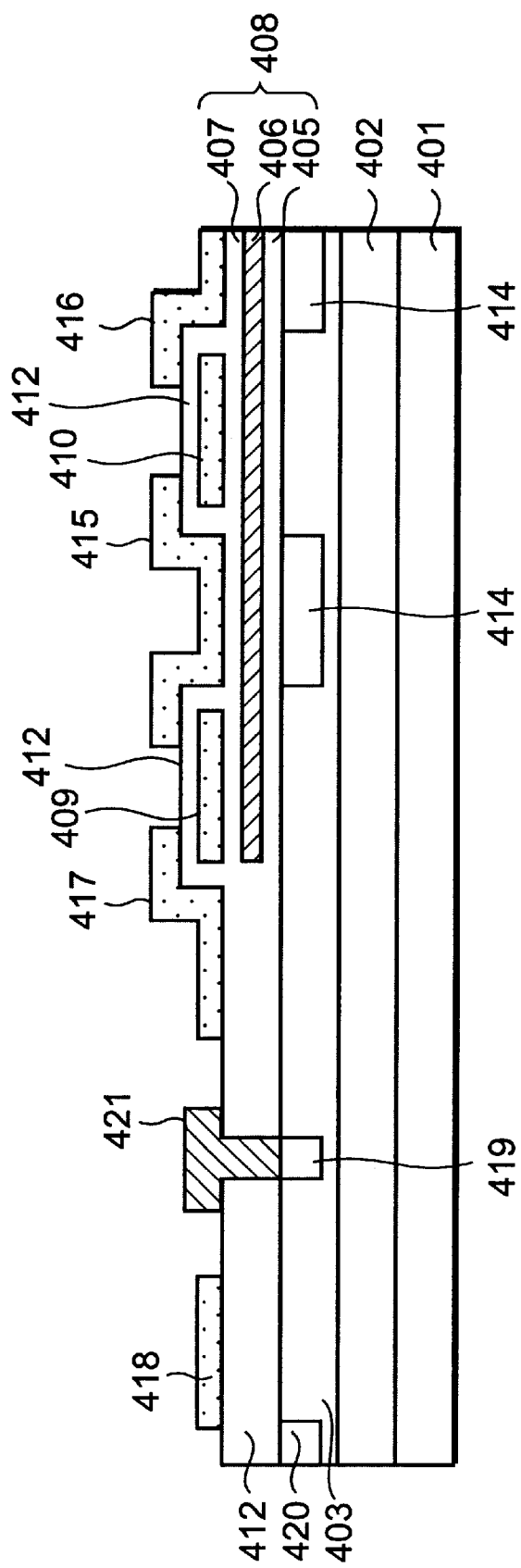
FIG. 14 is a sectional view showing the manufacture method in the periphery of the signal charge detector of the charge transfer apparatus according to the first embodiment of the present invention.

In FIG. 14, the forming of the high-concentration N-type impurity layer 419 and reset drain 420 is performed. A through hole is formed in the silicon oxide film 412 so as to reach the part of the high-concentration N-type impurity layer 419 with a floating diffusion layer capacity. In this contact part, the N⁺ layer extraction wiring 421 is formed and connected to the high-concentration N-type impurity layer 419 and output amplifier 103.

As described above, the signal charge detector A of the charge transfer apparatus is manufactured as shown in FIG. 4 according to the first embodiment of the present invention.

In the present embodiment, in the thermal oxidation process shown in FIG. 10, the silicon oxide film 407 under the storage electrode is not exposed, and the silicon oxide film 407 of the region expected to form the barrier electrode is exposed. However, by disposing the silicon nitride film 406 under the silicon oxide film 407, the thickness increase of the silicon oxide film 407 of the region expected to form the barrier electrode is suppressed. Additionally, since the silicon oxide film 407 under the storage electrodes 409 and 410 is masked with these electrodes, substantially no film thickness increase occurs. As a result, in the present embodiment, no film thickness difference is generated between the silicon oxide films under the storage electrode and barrier electrode.

When the gate insulation film 408 is constituted only of the silicon oxide film 407 without forming the silicon nitride film 406, and the storage and barrier electrodes are formed on this silicon oxide film 407, the film thickness difference is generated between the silicon oxide films under the both electrodes in the above-described thermal oxidation process. Specifically, the thickness of the silicon oxide film 407 under the storage electrode is unchanged, while the thickness of the silicon oxide film 407 of the region expected to form the barrier electrode increases, thereby causing a difference in thickness between the films. In the horizontal CCD, an impurity concentration difference is made between the channel region under the storage electrode and the adjacent channel region under the barrier electrode. Subsequently, the same pulse signal is * applied to the storage electrode and the barrier electrode which are adjacent to each other. As a result, a difference is generated in electric potential between the channel region under the storage electrode and the channel region under the barrier electrode to which the same pulse signal is applied and which are adjacent to each other, so that the charge transfer can be provided with the direction property. However, when the difference is generated in film thickness between the silicon oxide films under the storage and barrier electrodes, a dispersion is generated in the difference of the electric potential between the channel regions under these electrodes. As a result, since the complete charge transfer cannot be performed, problems occur such as the occurrence of a residual image.

In the present embodiment, however, by disposing the silicon nitride film 406 under the silicon oxide film 407, the film thickness difference is prevented from being generated between the silicon oxide films under the storage and barrier electrodes, so that the dispersion of the electric potential of the channel region under these electrodes can be suppressed.

On the other hand, the gate insulation film under the output electrode 417 and reset electrode 418 is constituted of one layer of the silicon oxide film 412, instead of the ONO film of the three-layer structure.

Therefore, the silicon nitride film in which the charge is easily trapped is not present in the gate insulation film under the output electrode 417 and reset electrode 418. As a result, even when charge-up occurs during etching for patterning these electrodes, no charge is trapped in the gate insulation film under these electrodes.

When the charge-up occurs, as a result, the electrode threshold value is dispersed. Since the predetermined fixed value of voltage is usually applied to the output electrode 417 and reset electrode 418, the dispersion of the optimum voltage of the output electrode 417 and the dispersion of the reset voltage caused by the threshold value dispersion raise a large problem on the characteristics. The influence of the electrode threshold value dispersion attributed to the charge-up particularly remarkably appears in the output electrode 417 and reset electrode 418 which are small in electrode capacity.

In the present embodiment, however, since the gate insulation film under the output electrode 417 and reset electrode 418 is constituted of one layer of the silicon oxide film 412, no charge is trapped. Therefore, the problems such as the dispersion of the output voltage and the charge transfer failure to the reset drain can be prevented. Furthermore, the decrease of a manufacture margin attributed to the reset voltage dispersion can also be prevented. As described above, since the gate insulation film under the output electrode 417 and reset electrode 418 is constituted of one layer of the silicon oxide film 412, the dispersion on the manufacture and the fluctuation of the characteristics can be suppressed.

Additionally, the ONO film is used in the gate insulation film 408 under the charge transfer electrodes 409, 410, 415, and 416 of the horizontal CCD 102 and in the gate insulation film under the charge transfer electrode of the vertical CCD (not shown). Therefore, the charge is trapped in the silicon nitride film 406 constituting the gate insulation film 408 by the charge-up which occurs during the etching to pattern the wiring and charge transfer electrodes 409, 410, 415, and 416. However, since the charge transfer electrode is constituted of a plurality of steps of electrodes, the capacity of the entire electrode is several times as large as that of the output electrode or the reset electrode. Therefore, even when the charge-up occurs in these regions during the manufacture, the threshold value dispersion hardly occurs as compared with the output electrode or the reset electrode. Therefore, even when the gate insulation film 408 of the part of the horizontal CCD 102 or the vertical CCD is formed of the ONO film, the problem attributed to the trap of the electric charge in the silicon nitride film 406 does not occur.

Here, the relation between the floating diffusion layer capacity and the detection sensitivity of the signal charge detector A will be described. Specifically, the relation among the detection capacity constituted of the floating diffusion layer 422 in the signal charge detector A, the gain of the output amplifier 103 of the output circuit, and the detection sensitivity in the conversion to the signal voltage from the signal charge will be described. The detection sensitivity indicates the efficiency of the conversion to the voltage from the charge, and the output voltage increases as this efficiency increases. Therefore, a higher detection sensitivity (charge/voltage conversion efficiency) is preferable.

When the detection capacity is Cfj (fF), and the gain of the output amplifier is g, the detection sensitivity is represented by the following equation.

$$\text{Detection sensitivity } (\mu V/e) = q \times g / Cfj \qquad \text{(Equation 1)}$$

Here, q denotes an element charge.

It is seen from this equation 1 that the detection sensitivity is enhanced as the detection capacity Cfj decreases and as the gain g increases.

The detection capacity Cfj is, in FIG. 4, mainly constituted of (1) the capacity between the reset electrode 418 and the high-concentration N-type impurity layer 419 and the capacity between the output electrode 417 and the high-concentration N-type impurity layer 419, (2) the capacity between the reset electrode 418 and the N$^+$ layer extraction wiring 421 and the capacity between the output electrode 417 and the N$^+$ layer extraction wiring 421 ((1) and (2) occupy 30% of the whole), (3) the capacity of the bottom surface of the floating diffusion layer 422 by the PN bonding (10% of the whole), (4) the gate input capacity of the first-step transistor of the output amplifier 103 (50% of the whole), and (5) other parasitic capacity of the N$^+$ layer extraction wiring 421 (10% of the whole). Among these, the bottom surface capacity (3) of the floating diffusion layer 422 by the PN bonding, which occupies 10% of the whole, can be reduced by reducing the area of the floating diffusion layer 422. However, the area reduction by fine division substantially reaches its limitation at present.

Therefore, the proportion of other wiring capacities and parasitic capacities increases. In the conventional art of the Japanese Patent Application Laid-Open No. 218104/1993, the charge transfer apparatus in which the upper-part insulation film 4b of the floating diffusion layer 422 is thickened is disclosed as a countermeasure for reducing the parasitic capacity.

In this conventional art, however, since only the upper-part insulation film of the floating diffusion layer 422 is thick, only the above-described component (2) is reduced. The gate film 5 under the output electrode 11 and reset electrode 13 only has the same thickness as that of the gate film 5 under the charge transfer electrodes 6, 8. Therefore, the components (1), that is, the capacity between the reset electrode 13 and the high-concentration N-type impurity layer and the capacity between the output electrode 10 and the high-concentration N-type impurity layer are not still reduced.

In the present embodiment, by forming the gate insulation film of the entire signal charge detector A to be as thick as 100 nm, the components (1) and (2) occupying 30% of the whole detection capacity are reduced. In this case, each of the distances between the reset electrode and the extraction electrode, between the output electrode and the extraction electrode, between the high-concentration N-type impurity layer and the reset electrode, and between the high-concentration N-type impurity layer and the output electrode is of the order of 0.5 μm to 1.5 μm. Moreover, the impurity concentration of the high-concentration N-type impurity layer is in a range of $10^{17}$ to $10^{19}$ atm/cm$^3$.

In the conventional art, the signal charge detector, particularly the gate insulation film under the output gate electrode 10 and reset gate electrode 13 is manufactured in the same process as that of the insulation film 5 under the horizontal charge transfer electrode. The insulation film 5 under the horizontal charge transfer electrode requires a certain degree of sufficient film thickness to strengthen a fringe electric field and enhance the charge transfer efficiency. On the other hand, however, according to the same principle as that the amount of accumulable charge decreases as the width between the electrodes increases, when the film thickness is excessively increased, the amount of transferable change per transfer electrode area decreases. Therefore, the thickness of the insulation film 5 cannot be increased from a range of about 70 nm to 80 nm.

Since the gate insulation film under the output gate electrode 10 and reset gate electrode 13 is formed in the same process as the process of forming the insulation film 5 under the horizontal charge transfer electrode, the insulation film 5 under the horizontal charge transfer electrode is formed in the thickness of the order of 70 nm to 80 nm, and additionally the gate insulation film under the output gate electrode 10 and reset gate electrode 13 is also automatically formed in a thickness of the order of 70 nm to 80 nm. Specifically, the thickness of the gate insulation film under the output gate electrode 10 and reset gate electrode 13 cannot selectively be increased from the range of about 70 nm to 80 nm.

On the other hand, in the method of manufacturing the semiconductor apparatus in the embodiment, after forming the gate insulation film 408 under the horizontal charge transfer electrode, that is, in the region of the horizontal CCD 102, the silicon oxide film 412 is formed in the signal charge detector A by thermal oxidation in the process shown in FIG. 10.

In the thermal oxidation process, the thickness of the silicon oxide film 407 under the storage electrodes 409, 410 is unchanged. Furthermore, since the silicon nitride film 406 is disposed in the lower layer of the silicon oxide film 417 of the region expected to form the barrier electrodes 415, 416, the film thickness is unchanged by the thermal oxidation. Therefore, the thermal oxidation can be performed so that a necessary thickness of silicon oxide film 412 is formed in the signal charge detector A.

Furthermore, in the manufacture method of the present embodiment, the etching is performed with respect to the final horizontal charge transfer electrode 409 in the self-matching manner in the process shown in FIG. 8 to remove the ONO film of the signal charge detector A. Therefore, when the thermal oxidation is performed in the process shown in FIG. 10, the securely thick silicon oxide film 412 can be formed also in the region of the signal charge detector A which is adjacent to the final horizontal charge transfer electrode 409. As a result, without forming any special mask, the thick silicon oxide film 409 can be formed in all the region under the output electrode 417 in which the final horizontal charge transfer electrode 409 is not present.

Second Embodiment

Figure 15:
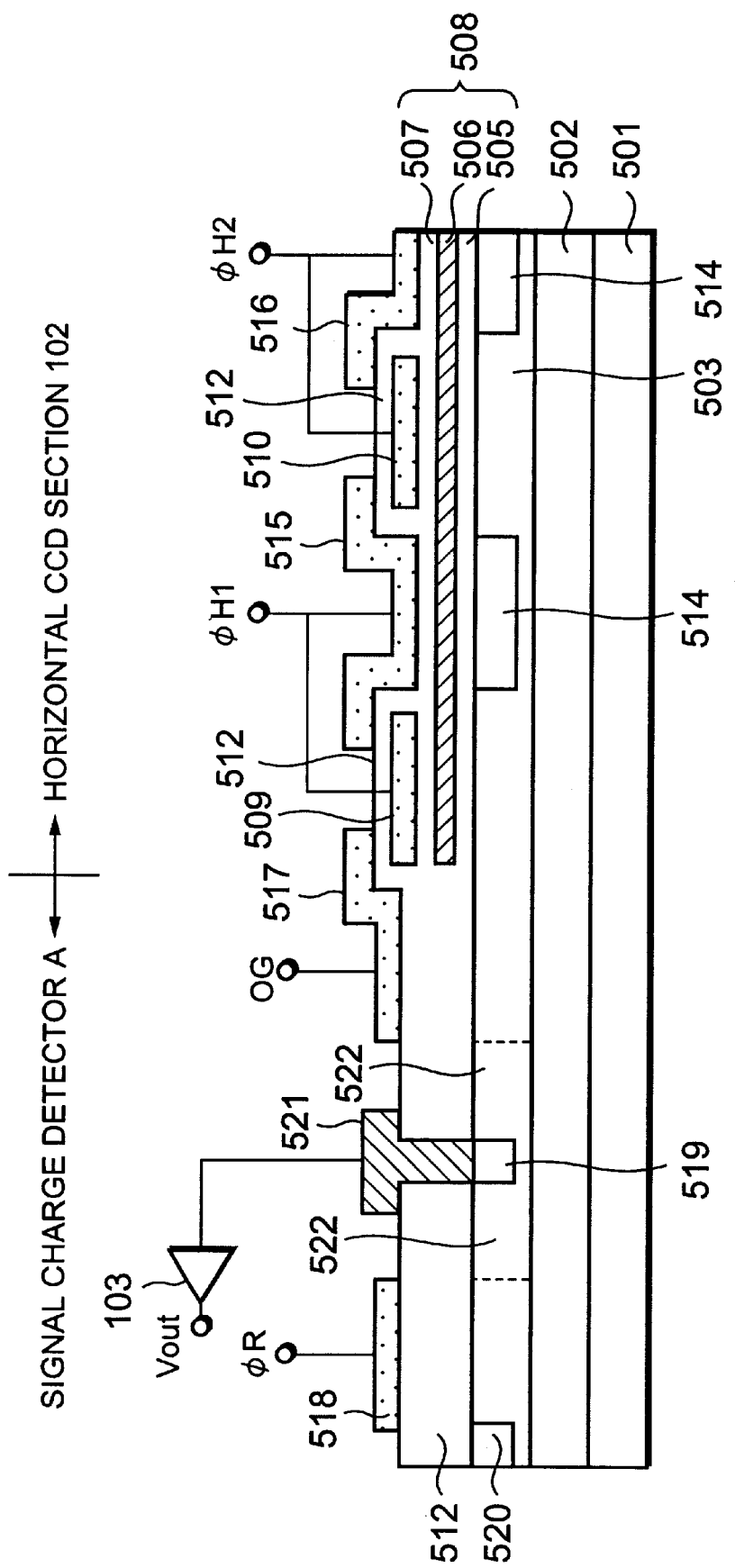
FIG. 15 is a sectional view in the periphery of the signal charge detector of the charge transfer apparatus according to a second embodiment of the present invention, and a sectional view along X–X' of FIG. 3.

FIG. 15 is a sectional schematic view of the charge transfer apparatus according to a second embodiment of the present invention.

The charge transfer apparatus of the second embodiment is characterized in that a gate insulation film 512 in the signal charge detector A is thicker than a gate insulation film 508 under the horizontal charge transfer electrode as compared with the charge transfer apparatus of the first embodiment.

Therefore, in the second embodiment, the detection capacity of the part of a floating diffusion layer 522 can further be reduced as compared with the charge transfer apparatus of the first embodiment.

In the second embodiment, since the gate insulation film 512 under an output electrode 517 and a reset electrode 518 is also thickened, the detection capacity can be reduced to be smaller than that of the charge transfer apparatus disclosed in the Japanese Patent Application Laid-Open No. 218104/1993. Particularly, the capacity between the lower parts of the output electrode 517 and N$^+$ layer extraction wiring 521 and the capacity between the lower parts of the reset electrode 518 and N$^+$ layer extraction wiring 521 are reduced.

In the present embodiment, in a similar manner as the first embodiment, since the threshold value dispersion of the output electrode or the reset electrode can be suppressed, and the detection capacity can also be reduced, the detection sensitivity can also be enhanced.

For the method of manufacturing the charge transfer apparatus in the second embodiment of the present invention, the description of the part common to that of the first embodiment is omitted. The different part lies in the process shown in FIG. 10. In the first embodiment, the thickness of the silicon oxide film 412 formed in the process shown in FIG. 10 is substantially equal to that of the gate insulation film 408 under the charge transfer electrodes 409, 410, 415, and 416. On the other hand, in the second embodiment, the gate insulation film 512 under the output electrode 517, on the floating diffusion layer 522, and under the reset electrode 518 is formed to be thicker than the gate film of charge transfer electrodes 509, 510, 515, and 516.

In the above two embodiments, the charge transfer apparatus has been described in which the charge transfer electrode of the horizontal CCD or the like is constituted of the two-layer polysilicon film. However, the charge transfer electrode is not limited to polysilicon. Moreover, the number of polysilicon layers for use in the entire device is not limited to two, and other parts such as the vertical CCD (not shown) may be formed of a three-layer polysilicon or a one-layer (single layer) polysilicon.

Moreover, in the above two embodiments, the output part of the horizontal CCD of the two-dimensional CCD image sensor has been described. However, the constitution can also be applied to a one-dimensional CCD type solid image pickup apparatus. Furthermore, the invention is not necessarily limited to the image sensor, and can also be applied, for example, to a CCD memory.

As described above, according to the present invention, since the gate insulation film under the output electrode and reset electrode is formed of the silicon oxide film in the vicinity of the signal charge detector of the charge transfer apparatus, the charge injection to the gate insulation film is unnecessary. Therefore, there is no fluctuation in the threshold value of the output electrode or the reset electrode, and the characteristic deterioration such as output voltage dispersion and reset failure can be prevented.

Furthermore, since the insulation film under the output electrode, on the floating diffusion layer, and under the reset electrode can be constituted of the one-layer silicon oxide film, the insulation film can be formed to be thicker than the gate insulation film under the charge transfer electrode.

Furthermore, by forming the silicon oxide film of the output electrode, floating diffusion layer, and reset electrode to be thicker than the insulation film under the charge transfer electrode, the parasitic capacity of the floating diffusion layer 422 can be reduced. As compared with the conventional art in which only the insulation film on the floating diffusion layer 422 is formed to be thick, in the present invention, the detection capacity can further be reduced. Since the detection capacity is reduced, the efficiency of converting the signal charge to the signal voltage is enhanced, and the detection sensitivity increases. Since the detection sensitivity increases, the output signal can be extracted as a larger voltage signal than that in the conventional art.

It is apparent that the present invention is not limited to the above embodiments, but may be modified and changed without departing from the scope and spirit of the invention.

What is claimed is:

1. A charge transfer apparatus in which
a charge transfer channel,
charge transfer electrodes formed on said charge transfer channel,
an output electrode positioned adjacent to the final charge transfer electrode of said charge transfer electrodes on one end of said charge transfer channel,
a diffusion region, adjacent to said output electrode, for accumulating a signal charge transferred through said charge transfer channel,
and a reset electrode, adjacent to said diffusion region, for discharging the charge accumulated in said diffusion region to a side different from the side of said output electrode are formed,
wherein a gate insulation film of said charge transfer electrode comprises a multilayered film of a first silicon oxide film, a silicon nitride film, and a second silicon oxide film,
and at least one of the gate insulation film films of said output electrode and said reset electrode is formed of a third silicon oxide film.

2. The charge transfer apparatus according to claim 1 wherein said third silicon oxide film is thicker than said first silicon oxide film.

3. The charge transfer apparatus according to claim 1 wherein said third silicon oxide film is thicker than said multilayered film.

* * * * *